United States Patent [15] 3,656,032

Henisch [45] Apr. 11, 1972

[54] CONTROLLABLE SEMICONDUCTOR SWITCH

[72] Inventor: Heinz K. Henisch, State College, Pa.

[73] Assignee: Energy Conversion Devices, Inc., Troy, Mich.

[22] Filed: Sept. 22, 1969

[21] Appl. No.: 859,630

[52] U.S. Cl...................317/235 R, 317/234 V, 317/234 F, 317/235 K, 317/235 N, 317/234 L, 317/235 T, 317/235 AC

[51] Int. Cl...................H01l 15/00, H01l 15/02, H01l 15/06

[58] Field of Search..................317/234, 235, 237, 238, 241, 317/7, 10, 48, 48.4, 234 V, 234 F, 235 K, 235 N, 234 L, 235 T, 235 AC, 235 L; 307/299

[56] References Cited

UNITED STATES PATENTS

| | | | |
|---|---|---|---|
| 3,271,591 | 9/1966 | Ovshinsky | 307/88.5 |
| 3,327,137 | 6/1967 | Ovshinsky | 307/88.5 |
| 3,432,729 | 3/1969 | Dyre | 317/234 |
| 3,461,296 | 8/1969 | Ovshinsky | 250/211 |
| 3,424,910 | 1/1969 | Mayer et al | 250/211 |

*Primary Examiner*—John W. Huckert
*Assistant Examiner*—Martin H. Edlow
*Attorney*—Wallenstein, Spangenberg, Hattis & Strampel and Edward G. Fiorito

[57] ABSTRACT

A controllable semiconductor switch comprises an anode, a cathode and a switchable amorphous semiconductor element interposed between the anode and cathode. The switchable amorphous semiconductor element has a high electrical resistance for substantially blocking current between the anode and cathode, and it, upon the application of a voltage above a threshold voltage value to the anode and cathode of the semiconductor switch, is capable of having at least portions thereof between the anode and cathode substantially instantaneously changed to a low electrical resistance for substantially conducting current between the anode and cathode. The anode or cathode or both may comprise a semiconductor which regulates the threshold voltage value of the semiconductor switch. Where the cathode or anode comprises a semiconductor and the other a metal, the semiconductor switch may be asymmetric in its operation, it having a higher threshold voltage value for one polarity of the voltage applied to the anode or cathode than for the opposite polarity. By controlling the semiconductor anode and/or cathode the threshold voltage value of the semiconductor switch may be varied or regulated to desired values.

17 Claims, 10 Drawing Figures

Inventor
Heinz K. Henisch
By: Wallenstein, Spangenberg, Hattis & Strampel atty's.

CONTROLLABLE SEMICONDUCTOR SWITCH

The principal object of this invention is to provide a semiconductor switch having an anode and cathode (electrodes) and a switchable amorphous semiconductor element interposed therebetween, wherein at least one of the anode and cathode (electrodes) is a semiconductor, wherein the semiconductor switch may be asymmetrical in its switching operation, wherein said at least one semiconductor anode and cathode (electrodes) may be controlled so as to vary or regulate the threshold voltage values at which the semiconductor switch is switched from its current blocking condition to its current conducting condition, wherein the controllable semiconductor anode and/or cathode may be controlled by a controlled injection contact, wherein the controllable semiconductor anode and/or cathode may be controlled by conditions affecting the same, such as, by light within a predetermined wave length range, wherein the semiconductor anode and/or cathode may be transparent to light within a predetermined wave length range so that such light may directly affect the switchable semiconductor element at the interfaces thereof with the anode and/or cathode, and wherein the semiconductor anode and/or cathode may be of the n-type or p-type.

Other objects and advantages of this invention will become apparent to those skilled in the art upon reference to the accompanying specification, claims and drawing in which:

Figure 3:
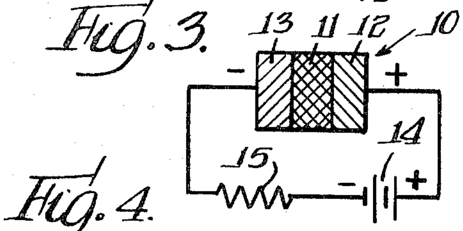
FIG. 3 is a diagrammatic illustration of a semiconductor switch arranged in a simple load circuit.

Referring first to FIG. 3, a semiconductor switch is generally designated at 10. It includes a switchable amorphous semiconductor element 11 which is interposed between electrodes 12 and 13. The electrodes 12 and 13 connect the semiconductor switch 10 in a load circuit which is illustrated to include a variable source of D.C. voltage 14 and a load resistance 15. Due to the polarity of the voltage illustrated in the circuit, the electrode 12 will hereinafter be referred to as the anode and the electrode 13 as the cathode. Suitable positive and negative voltage signs are shown with the result that the conventional positive current is in a counterclockwise direction and the direction of electron flow is in the clockwise direction. Also, in FIG. 3 both the anode 12 and the cathode 13 are shown as metal electrodes for the purposes of the following discussion.

The switchable amorphous semiconductor element 11 is free from p-n junctions and the anode and cathode 12 and 13 are in non-rectifying contact therewith. The resistance at the interfaces between the switchable amorphous semiconductor element and the anode 12 and cathode 13 is small. The resistance of the switchable amorphous semiconductor element 11 is high. Preferably the switchable amorphous semiconductor element is made from polymeric type materials which include polymeric networks and the like having covalent bonding and cross linking resistant to crystallization, which are in a locally organized disordered state or condition which is generally amorphous (not crystalline) but which may possibly contain relatively small crystals or chain or ring segments which would probably be maintained in randomly oriented position therein by the cross linking. These polymeric structures may be one, two or three dimensional structures. Such a structure may comprise a composition of a plurality of chemically dissimilar elements at least some of which are of the polymeric type having the ability to form covalent chain or ring like and cross link bonds. Such polymeric type elements include boron, carbon, silicon, germanium, tin, lead, nitrogen, phosphorous, arsenic, antimony, bismuth, oxygen, sulphur, selenium, tellurium, hydrogen, fluorine and chlorine. Of these polymeric type elements, oxygen, sulphur, selenium and tellurium are particularly useful since they and mixtures containing them have quite low and favorable carrier mobility characteristics. Of these polymeric type elements, silicon, germanium, phosphorous, arsenic and the like and, also, aluminum, gallium, indium, thallium, lead, bismuth and the like are particularly useful since they effectively form covalent bonds or cross links between the polymeric like chain or ring segments to return or maintain the latter in the locally organized disordered and generally amorphous state or condition.

Pluralities of the aforementioned elements may be combined with each other and/or other elements in appropriate percentages to provide the generally amorphous structure. While many different materials may be utilized, for example, these materials can be tellurides, selenides, sulfides or oxides of substantially any metal, or metalloid or intermetallic compound or semiconductor, or solid solutions, mixtures or alloys thereof, particularly good results being obtained where tellurium or selenium are utilized and where oxides of the transition metals such as vanadium, tantalum, niobium and zirconium and mixtures thereof are utilized. Specific examples of switchable amorphous semiconductor materials are set forth in Ovshinsky U.S. Pat. No. 3,271,591.

The switchable amorphous semiconductor element may be considered as an intrinsic semiconductor, or almost an intrinsic semiconductor, i.e., that electrons and holes providing the current carriers take part in substantially equal concentrations. The switchable amorphous semiconductor element also includes a vast number of trapping centers or current carrier traps including electron traps and hole traps which are present in substantially equal concentrations and this is at least one of the reasons why the switchable amorphous semiconductor element has a high resistance and is switchable.

Figure 1:
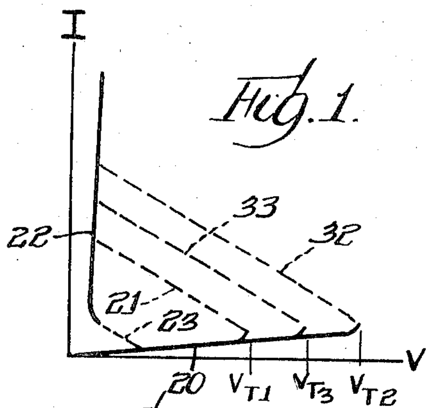
FIG. 1 is a voltage-current curve illustrating the operation of the semiconductor switch of this invention with an applied voltage of one polarity.

The manner in which the semiconductor switch operates is illustrated by the voltage-current curves of FIG. 1. With the semiconductor switch in its blocking state or condition, as the applied voltage is gradually increased from zero, the resistance of at least portions or paths of the switchable amorphous semiconductor element between the electrodes decreases as indicated at 20 in FIG. 1. When the voltage applied to the anode 12 and cathode 13 increases to a value $V_{T1}$, corresponding to the voltage threshold value of the device, said at least portions or paths of the switchable amorphous semiconductor material between the electrodes (at least one path or filament or thread between the electrodes), are substantially instantaneously changed to a low resistance or conducting state or condition for conducting current therethrough. The substantially instantaneous switching of said at least portions or paths of the semiconductor material from their high resistance or blocking state or condition to their low resistance or substantially conducting state or condition is depicted by the dotted curve 21 in FIG. 1. The "-switching" time for switching from the blocking state to the conducting state is extremely short, substantially instantaneous, although a short time delay is involved in setting up the substantially instantaneous switching. The conducting condition of the semiconductor switch is illustrated by the curve 22. When the applied voltage is lowered to a value to decrease the current to a value below a minimum current holding value, the low resistance conducting condition follows substantially the curve 23 and immediately causes switching to the high resistance or blocking condition. The semiconductor switch will remain in its blocking condition until switched to its conducting condition by the application of a threshold voltage as described above. The voltage current characteristics are not shown to scale in FIG. 1 but are merely illustrated, for the ratio of blocking resistance to the resistance in the conducting state or condition is usually larger than 100,000:1. In its low resistance or conducting state or condition the resistance may be as low as 1 ohm or less as determined by the small voltage drop thereacross and, also, the holding current for the switch may be very small.

Figure 4:
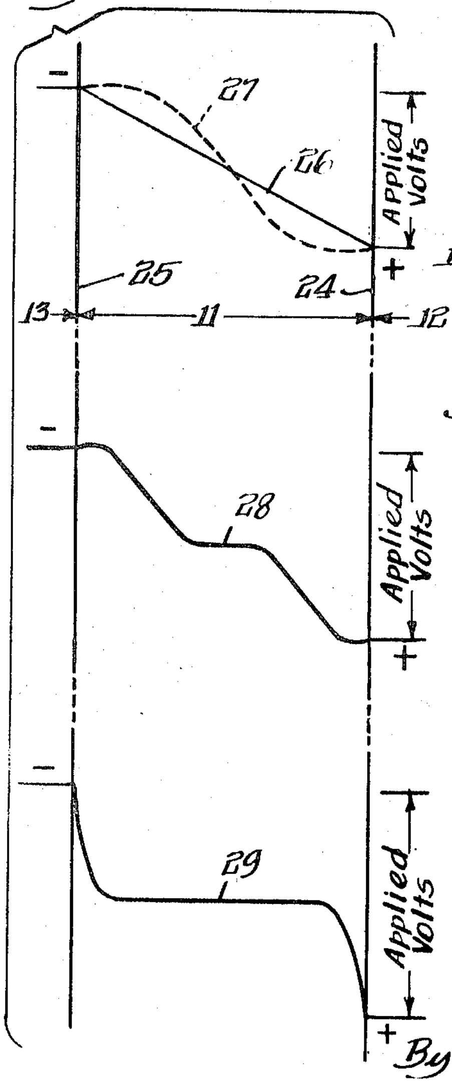
FIG. 4 is a graph illustrating field conditions across the switchable semiconductor element of the semiconductor switch at various phases of the operation thereof.

The breakdown or switching from the blocking condition to the conducting condition is essentially electronic switching and a brief possible explanation thereof is here given with respect to FIG. 4. In that figure, the interface between the anode 12 and the switchable amorphous semiconductor element 11 is indicated at 24 and the interface between the cathode 13 and the switchable amorphous semiconductor element 11 is indicated at 25. The polarity of the applied voltage is also indicated. FIG. 4 is a model illustrating the fields in the switchable amorphous semiconductor material, the upper portion representing pre-breakdown, the middle portion the beginning of breakdown, and the bottom portion after breakdown.

The curve 26 represents the field in the absence of space charge and this field initially operates to exclude excess current carriers as by decreasing and sweeping out excess current carrier concentration since any excess current carriers lost to the electrodes will not be replenished at the other electrode, or by trapping the excess current carriers near the electrodes. This exclusion of the excess current carriers generates space charges at the electrodes (the space charge at the anode being opposite to that at the cathode), distorts the field, such as indicated by the dotted curve 27 in FIG. 4, and provides a non-equilibrium distribution of current carriers.

It is suggested that these growing space charges, field distortion and non-equilibrium conditions are initiated mainly by bulk mechanisms in the switchable amorphous semiconductor element 11 and that subsequently these growths are dominated by anode and cathode injection of current carriers. It is also suggested that following a short time delay the expanding space charges at the anode and cathode overlap and where they do, the semiconductor material becomes neutral and highly conductive which occurs with a further distortion of the field as indicated by the curve 28 in the middle portion of FIG. 4. This highly conductive condition is indicated by the flat portion at the center of the curve 28 and represents the beginning of the electronic breakdown. At this point, current carriers are being injected into the semiconductor material 11 by the anode 12 and cathode 13 at the interfaces 24 and 25, the anode injecting holes and the cathode injecting electrons.

This highly conductive condition will not support the high field and the voltage distribution between the anode and cathode will thus be changed. More voltage than before will appear across the regions which still have their space charges and this will increase the overlap region as illustrated by curve 29 at the bottom of FIG. 4. All of this occurs as a catastrophic breakdown and takes place substantially instantaneously. The curve 29 illustrates the completion of the breakdown, where substantially all of the electron traps are full of electrons and the hole traps are full of holes, the traps being immobilized as far as any carrier influx is concerned. Since there are no trapping and no space charges, except immediately adjacent the anode and cathode, there is no real impediment to current flow.

Following the initial short time delay required for initially distorting the field, the initiation of the electrical breakdown is instituted by the injection of holes by the anode and electrons by the cathode and the breakdown is substantially instantaneously completed and conduction is continued by such carrier injection. Since the switching from the blocking condition to the conducting condition is dependent upon carrier injection, the threshold voltage value at which switching occurs is dependent upon carrier injection, and if such carrier injection is controlled the threshold voltage value can also be controlled. Since highly conductive electrodes, such as, metal electrodes, have large concentration or supply of holes and electrons and can readily and easily inject both holes and electrons into the switchable semiconductor element, the threshold voltage values can be relatively low as indicated at $V_{T1}$ in FIG. 1 and where both the anode and cathode are metal, the switch will be symmetrical in its operation for either polarity and, in fact, symmetrical switching for A.C. operation can be obtained, all as indicated by the threshold voltage values $V_{T1}$ and $-V_{T1}$ in FIG. 2.

In accordance with this invention, the anode or cathode or both comprise a semiconductor where the injections of current carriers into the switchable amorphous semiconductor element are different than those afforded by metal anodes or cathodes. In other words, the threshold voltage values applied to the semiconductor anodes and cathodes for injecting current carriers to provide the switching will be different from those involving metal anodes and/or electrodes, the former being higher than the latter. Furthermore, the amount of injection by the semiconductor electrodes may be controlled to vary and regulate the threshold voltage values. The semiconductor anodes and cathodes may comprise p-type or n-type semiconductors and they may be crystalline or amorphous. Substantially any semiconductor materials may be used, but particularly useful are germanium and silicon semiconductors which may be of the p-type or n-type, as desired.

Figures 5, 6, 7:
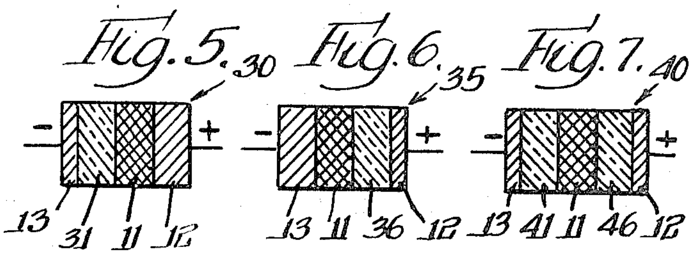
FIGS. 5 to 10 are diagrammatic illustrations of various forms of the semiconductor switches of this invention which may be utilized in the simplified circuit of FIG. 3.

One form of the semiconductor switch of this invention is diagrammatically illustrated at 30 in FIG. 5. In addition to including the switchable amorphous semiconductor element 11 and the anode 12 which may be formed of a suitable metal, the cathode 13 is formed of a semiconductor material 31 which may be of the p-type. When it is included in the circuit of FIG. 3 with the polarities indicated, the breakdown will be dependent upon the injection of electrons (minority carriers) from the semiconductor 31 into the switchable semiconductor material 11. Since the cathode 31 is a p-type the semiconductor material, its concentration or supply of electrons (the minority carriers) is very limited as compared to the concentration or supply of holes by the anode 12. As a result, a greater voltage will be required to cause the breakdown. This threshold voltage is indicated at $V_{T2}$ in FIG. 1. When this greater threshold voltage is applied, the semiconductor switch 30 will substantially instantaneously switch along the dotted curve 32 in FIG. 1 to the conducting condition illustrated by the curve 22. In other words, a higher field afforded by the higher breakdown voltage $V_{T2}$ is required to switch the semiconductor switch 30. If the semiconductor material of the cathode 31 is controlled to increase the supply of electrons, the threshold voltage value required to switch the semiconductor switch 30 would be decreased as indicated at $V_{T3}$ in FIG. 1, the switching taking place along the dotted curve 33. This increase in the concentration or supply of electrons could be afforded by subjecting the cathode 31 to a condition which would increase the concentration or supply of electrons, as for example, by exposing the same to light within a wave length range to which the semiconductor cathode 31 is not transparent. Thus, the concentration or supply of electrons could be modulated in accordance with the condition affecting the semiconductor cathode so as to vary and regulate the threshold voltage value between $V_{T2}$ and $V_{T3}$ at which the semiconductor switch 30 is switched.

Figure 2:
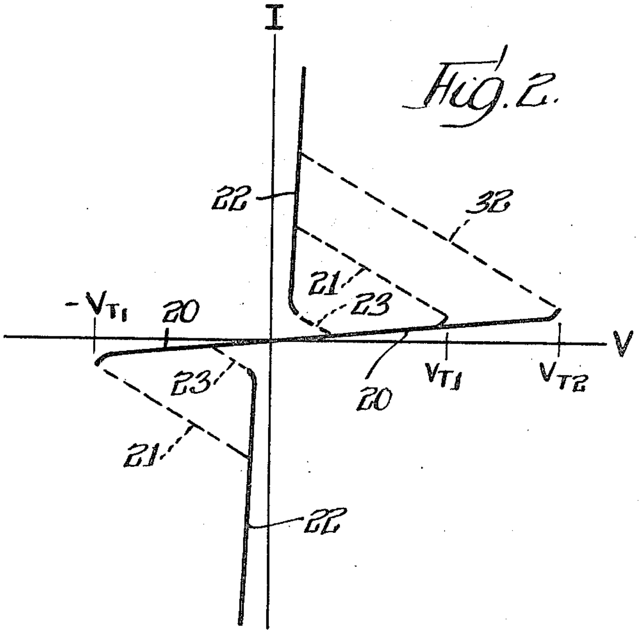
FIG. 2 is a voltage-current curve illustrating the operation of the semiconductor switch of this invention with applied voltages of opposite polarities.

If the polarity of the applied voltage is reversed so as to make the semiconductor electrode 31 the anode and the metal electrode 12 the cathode, the device will switch from the blocking condition to the conducting condition at a lesser applied voltage as indicated at $-V_{T1}$ in the opposite quadrant of FIG. 2. This is made possible since the p-type semiconductor electrode 31 will have a greater concentration or supply of holes and will inject a greater amount of holes (the majority carriers) and the now metal cathode would inject adequate electrons. As a result, the semiconductor switch 30 is asymmetric in its switching operation, it requiring a high threshold voltage in the positive direction and a lower threshold voltage in cathode, negative direction for switching from the blocking condition to the conducting condition.

In FIG. 6, in addition to the switchable amorphous semiconductor element 11 and the metal electrode 13, the semiconductor switch generally designated at 35 has the anode 12 formed of a semiconductor material which may be of the n-type. When the switch 35 is subjected to a voltage of the polarity illustrated in FIG. 3, the metal cathode 13 will inject electrons into the semiconductor element 11 and the semiconductor anode 36 will inject holes (the minority carriers) into the semiconductor element 11. Since the concentration or supply of holes (minority carriers) in the semiconductor anode 36 is limited, a threshold voltage value of substantially $V_{T2}$, as illustrated in FIG. 1, will be required to cause the switching from the blocking condition to the conducting condition. When the polarity of the applied voltage is reversed, the semiconductor anode 36 will become the cathode and the metal cathode 13 will become the anode. Since the now semiconductor cathode will inject more electrons (the majority carriers) and the now metal anode will inject adequate holes, the switch 35 will switch at a lower threshold value as indicated at $-V_{T1}$ in the opposite quadrant in FIG. 2. Thus, the semiconductor switch 30 of FIG. 5 and the semiconductor switch 35 of FIG. 6 will operate to produce substantially the same switching functions as illustrated in FIGS. 1 and 2.

In FIG. 7, the semiconductor switch, generally designated at 40, in addition to including the switchable amorphous semiconductor element 11 also has the cathode 13 formed of a semiconductor material 41 and the anode 12 formed of a semiconductor material 46. Preferably the semiconductor material 41 is of the p-type and 46 is of the n-type. The semiconductor material 41 will inject electrons (the minority carriers) into the semiconductor element 11 and the semiconductor material 46 will inject holes (the minority carriers) into the semiconductor element 11. Since the minority carriers (electrons and holes) are limited, the semiconductor switch 40 will switch at substantially the threshold voltage $V_{T2}$ in FIG. 1 with the indicated polarity. When the polarity of the applied voltage is reversed, the semiconductor cathode 41 will become the anode and the semiconductor anode 46 will become the cathode, and since the injection of electrons and holes (the majority carriers) will be greater than for the initial polarity, the semiconductor switch 40 will switch at a lower threshold voltage value, such as the threshold voltage value $-V_{T1}$ in the opposite quadrant in FIG. 2.

Figures 8, 9:
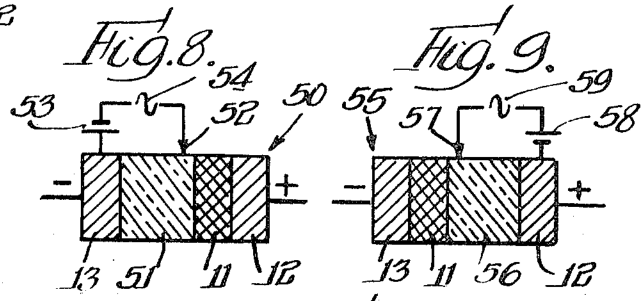

The semiconductor switch generally designated at 50 in FIG. 8 is generally like the semiconductor switch 30 of FIG. 5 and the operation will be substantially the same as that described above in connection with FIG. 5. Here, however, the semiconductor cathode 51, which may be of the p-type, has a controlled injection contact 52 which is biased by a biasing voltage 53 and a signal transducer 54. By manipulating the signal transducer 54 the concentration or supply and injection of electrons by the controlled semiconductor 51 may be varied to vary the threshold value between the values $V_{T2}$ and $V_{T3}$ as indicated in FIG. 1.

The semiconductor switch, generally designated at 55 in FIG. 9, is similar to the semiconductor switch 35 of FIG. 6 and operates in substantially the same manner as discussed above in connection with FIG. 6. Here, the semiconductor anode 56, which may be of the n-type, is controlled by an injection contact 57 biased by a voltage 58 and controlled by a signal transducer 59. By adjusting the signal transducer 59 the concentration or supply and injection of the holes by the semiconductor 56 into the switchable semiconductor element 11 may be regulated so as to vary the threshold voltage values required to cause switching from the blocking condition to the conducting condition between $V_{T2}$ and $V_{T3}$ as illustrated in FIG. 1.

Figure 10:
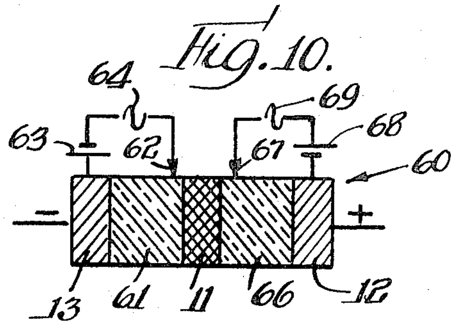

The semiconductor switch, generally designated at 60 in FIG. 10, is substantially a combination of the semiconductor switches 50 and 55 of FIGS. 8 and 9. Here, the cathode 13 comprises a semiconductor material 61, which may be of the p-type, which is controlled by an injection contact 62 biased by a voltage source 63 and controlled by a signal transducer 64. Here, also, the anode 12 includes a semiconductor material 66, which may be of the n-type, which is controlled by an injection contact 67 biased by a voltage source 68 and controlled by a signal transducer 69. The semiconductor cathode 61 injects electrons (minority carriers) and the semiconductor anode 66 injects holes (minority carriers) into the switchable semiconductor element 11. By appropriate adjustment of the signal transducers 64 and 69 the threshold voltage values at which the semiconductor switch 60 is switched from the blocking condition to the conducting condition may be varied and regulated.

When the polarity of the applied voltage is reversed with respect to the semiconductor switches 50, 55 and 60 of FIGS. 8, 9, and 10, the controlled injection contacts may also be utilized for varying and regulating the concentration or supply and injection of electrons and holes (the majority carriers) so as to control and regulate the threshold voltage values of the switches in the opposite quadrant of FIG. 2.

The semiconductor cathode 31 of the semiconductor switch 30 of FIG. 5 and the semiconductor anode 36 of the semiconductor switch 35 of FIG. 6 may be made transparent to light within a predetermined wave length range and when this is done, light within that range may penetrate the cathode and anode so as to affect directly the switchable amorphous semiconductor element 11 at the interfaces thereof with the cathode and anode. The asymmetric operation of the semiconductor switches of this invention would make them particularly useful in detecting polarity of voltage signals applied thereto, they switching with a voltage value of one polarity but not with the same voltage value for the opposite polarity.

The foregoing description has been made in connection with a non-memory type of semiconductor switch which requires a holding current above a minimum current holding value to maintain the switch in its conducting condition, this being referred to as a "Mechanism Device" in the aforementioned Ovshinsky, U.S. Pat. No. 3,271,591. However, this invention is also applicable to a memory type semiconductor switch which does not require a holding current to maintain the switch in its conducting condition, such as the switches referred to in said Ovshinsky patent as the "Hi-Lo and Circuit Breaker" devices of that patent. The switching of both the non-memory and memory type semiconductor switches from the blocking condition to the conducting condition is substantially the same and applicable to both.

While for purposes of illustration several forms of this invention have been disclosed, other forms thereof may become apparent to those skilled in the art upon reference to this disclosure and, therefore, this invention is to be limited only by the scope of the appended claims.

I claim:

1. A controllable semiconductor switch comprising an anode, a cathode and a switchable amorphous semiconductor element interposed between the anode and cathode having interface contact therewith and having a relatively high electrical resistance for substantially blocking current between the anode and cathode, said switchable amorphous semiconductor element, upon the application of a voltage above a threshold voltage value to the anode and cathode of the semiconductor switch, being capable of having at least portions thereof between the anode and cathode substantially instantaneously changed to a relatively low electrical resistance for substantially conducting current between the anode and cathode, at least one of said anode and cathode being a semiconductor which is substantially transparent to light within a predetermined wave length range, and said switchable amorphous semiconductor element being substantially non-transparent to light within said predetermined wave length range, whereby light within said predetermined wave length range penetrating through said at least one anode and cathode effects directly said switchable amorphous semiconductor element at the interface thereof with said at least one anode and cathode for regulating the threshold voltage value at which the switching to the relatively low resistance takes place.

2. A controllable semiconductor switch comprising an anode, a cathode and a switchable amorphous semiconductor element interposed between the anode and cathode and having a relatively high electrical resistance for substantially blocking current between the anode and cathode, said switchable amorphous semiconductor element, upon the application of a voltage above a threshold voltage value to the anode and cathode of the semiconductor switch, being capable of having at least portions thereof between the anode and cathode substantially instantaneously changed to a relatively low electrical resistance for substantially conducting current between the anode and cathode, at least one of said anode and cathode being a semiconductor having concentrations of current carriers therein for injection therefrom into said switchable amorphous semiconductor element by the voltage applied to said anode and cathode and having means for regulating the concentrations of said current carriers therein for controlling the amount of injection of said current carriers therefrom into said switchable amorphous semiconductor element and, hence, for regulating the threshold voltage value at which the switching to the relatively low resistance takes place.

3. A controllable semiconductor switch comprising an anode, a cathode and a switchable amorphous semiconductor element interposed between the anode and cathode and having current carrier traps for providing a relatively high electrical resistance for substantially blocking current between the anode and cathode, said anode and cathode having concentrations of current carriers therein and being capable of injecting said current carriers therefrom into the switchable amorphous semiconductor element by applying a voltage to said anode and cathode, and said switchable amorphous semiconductor element, upon the application of a voltage above a threshold voltage value to the anode and cathode of the semiconductor switch, being capable of having the current carrier traps in at least portions thereof between the anode and cathode filled with current carriers to substantially instantaneously provide a relatively low electrical resistance for substantially conducting current between the anode and cathode, at least one of said anode and cathode being a semiconductor having means for regulating the concentrations of said current carriers therein for controlling the amount of injection of said current carriers therefrom into said switchable amorphous semiconductor element by the applied voltage and, hence, for regulating the threshold voltage value at which the switching to the low resistance takes place.

4. A controllable semiconductor switch as defined in claim 2 wherein said at least one semiconductor anode and cathode having means for regulating the concentrations of said current carriers therein is a crystalline semiconductor.

5. A controllable semiconductor switch as defined in claim 2 wherein said at least one semiconductor anode and cathode having means for regulating the concentrations of said current carriers therein is an amorphous semiconductor.

6. A controllable semiconductor switch as defined in claim 2 wherein said at least one semiconductor anode and cathode having means for regulating the concentrations of said current carriers therein is a p-type semiconductor.

7. A controllable semiconductor switch as defined in claim 2 wherein said at least one semiconductor anode and cathode having means for regulating the concentrations of said current carriers therein is an n-type semiconductor.

8. A controllable semiconductor switch as defined in claim 2 wherein one of said anode and cathode is a semiconductor having means for regulating the concentrations of said current carriers therein and the other is a metal.

9. A controllable semiconductor as defined in claim 2 wherein both of said anode and cathode are semiconductors having means for regulating the concentrations of said current carriers therein.

10. A controllable semiconductor switch as defined in claim 2 wherein said at least one semiconductor anode and cathode has its means for regulating the concentrations of said current carriers therein varied by a condition affecting said means for regulating the concentrations of said current carriers in said at least one semiconductor anode and cathode, wherein said condition is light within a predetermined wave length range, and wherein said at least one controllable semiconductor anode and cathode is substantially non-transparent to such light.

11. A controllable semiconductor switch as defined in claim 2 wherein said means for regulating the concentrations of said current carriers in said at least one semiconductor anode and cathode includes a controlled injection contact for said at least one semiconductor anode and cathode.

12. A controllable semiconductor switch as defined in claim 2 wherein said at least one of said anode and cathode is an n-type semiconductor anode or a p-type semiconductor cathode having concentrations of minority current carriers therein for injection therefrom into said switchable amorphous semiconductor element by the voltage applied to said anode and cathode and having means for regulating the concentrations of said minority current carriers therein for controlling the amount of injection of said minority current carriers therefrom into said switchable amorphous semiconductor element and, hence, for regulating the threshold voltage value at which the switching to the relatively low resistance takes place.

13. A controllable semiconductor switch as defined in claim 12 wherein said anode is said n-type semiconductor and said cathode is metal.

14. A controllable semiconductor switch as defined in claim 12 wherein said cathode is said p-type semiconductor and said anode is metal.

15. A controllable semiconductor switch as defined in claim 12 wherein both said anode is said n-type semiconductor and said cathode is said p-type semiconductor.

16. A controllable semiconductor switch as defined in claim 12 wherein, upon reversal of the polarity of the applied voltage, said n-type semiconductor is the cathode and said p-type semiconductor is the anode having concentrations of majority current carriers therein for injection therefrom into said switchable amorphous semiconductor element by the voltage of reverse polarity applied thereto to provide a lower threshold voltage value at which the switching to the relatively low resistance takes place.

17. A controllable semiconductor switch as defined in claim 16 wherein said at least one cathode and anode have means for regulating the concentrations of said majority current carriers for controlling the amount of injection of said majority current carriers therefrom into said switchable amorphous semiconductor and, hence, for regulating the lower threshold voltage value for said reverse polarity of the applied voltage at which the switching to the relatively low resistance takes place.

* * * * *